United States Patent
Lee et al.

(10) Patent No.: US 8,039,962 B2
(45) Date of Patent: Oct. 18, 2011

(54) SEMICONDUCTOR CHIP, METHOD OF FABRICATING THE SAME AND STACK PACKAGE HAVING THE SAME

(75) Inventors: Min-Hyung Lee, CheongJu-si (KR); Oh-Jin Jung, Sucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 487 days.

(21) Appl. No.: 12/169,031

(22) Filed: Jul. 8, 2008

(65) Prior Publication Data
US 2009/0014888 A1    Jan. 15, 2009

(30) Foreign Application Priority Data
Jul. 12, 2007 (KR) .................. 10-2007-0069967

(51) Int. Cl.
*H01L 23/48* (2006.01)
*H01L 23/52* (2006.01)
*H01L 29/40* (2006.01)

(52) U.S. Cl. ........................ 257/758; 257/750

(58) Field of Classification Search .................. 257/686, 257/777, 723, 724, 750, 758
See application file for complete search history.

(56) References Cited

U.S. PATENT DOCUMENTS

| | | | |
|---|---|---|---|
| 5,229,647 A * | 7/1993 | Gnadinger | 257/785 |
| 6,429,096 B1 | 8/2002 | Yanagida | |
| 6,800,930 B2 * | 10/2004 | Jackson et al. | 257/700 |
| 6,809,421 B1 * | 10/2004 | Hayasaka et al. | 257/777 |
| 2002/0017710 A1 | 2/2002 | Kurashima et al. | |
| 2004/0080040 A1 * | 4/2004 | Dotta et al. | 257/698 |
| 2004/0188837 A1 | 9/2004 | Kim et al. | |
| 2005/0104181 A1 * | 5/2005 | Lee et al. | 257/686 |
| 2005/0224921 A1 * | 10/2005 | Gupta et al. | 257/621 |
| 2007/0001281 A1 * | 1/2007 | Ishino et al. | 257/686 |
| 2007/0194427 A1 * | 8/2007 | Choi et al. | 257/686 |
| 2010/0065953 A1 * | 3/2010 | Egawa | 257/686 |
| 2010/0171209 A1 * | 7/2010 | Tanie et al. | 257/686 |
| 2010/0224977 A1 * | 9/2010 | Kim | 257/686 |
| 2010/0258933 A1 * | 10/2010 | Fujishima et al. | 257/686 |

FOREIGN PATENT DOCUMENTS

| | | |
|---|---|---|
| CN | 1162901 C | 8/2004 |
| CN | 1320644 C | 6/2007 |
| KR | 10-2005-0021078 | 3/2005 |
| KR | 10-2006-0053177 | 5/2006 |

* cited by examiner

*Primary Examiner* — S. V. Clark
(74) *Attorney, Agent, or Firm* — Sherr & Vaughn, PLLC

(57) ABSTRACT

A semiconductor chip may include a wafer, a semiconductor device formed on the wafer, a first dielectric layer formed on the wafer and the semiconductor device, a first metal interconnection formed on the first dielectric layer, a second dielectric layer formed on the first dielectric layer and the lower interconnection, and a third dielectric layer formed on the second dielectric layer. A second metal interconnection may be formed in the third dielectric layer, a first nitride layer formed on the third dielectric layer and the first metal interconnection, a via hole extending through the wafer, the first dielectric layer, the second dielectric layer, the third dielectric layer and the first nitride layer, a via formed in the via hole and a third metal interconnection formed on the first oxide layer, an exposed upper end of the via and the second metal interconnection.

8 Claims, 8 Drawing Sheets

Figure 1:
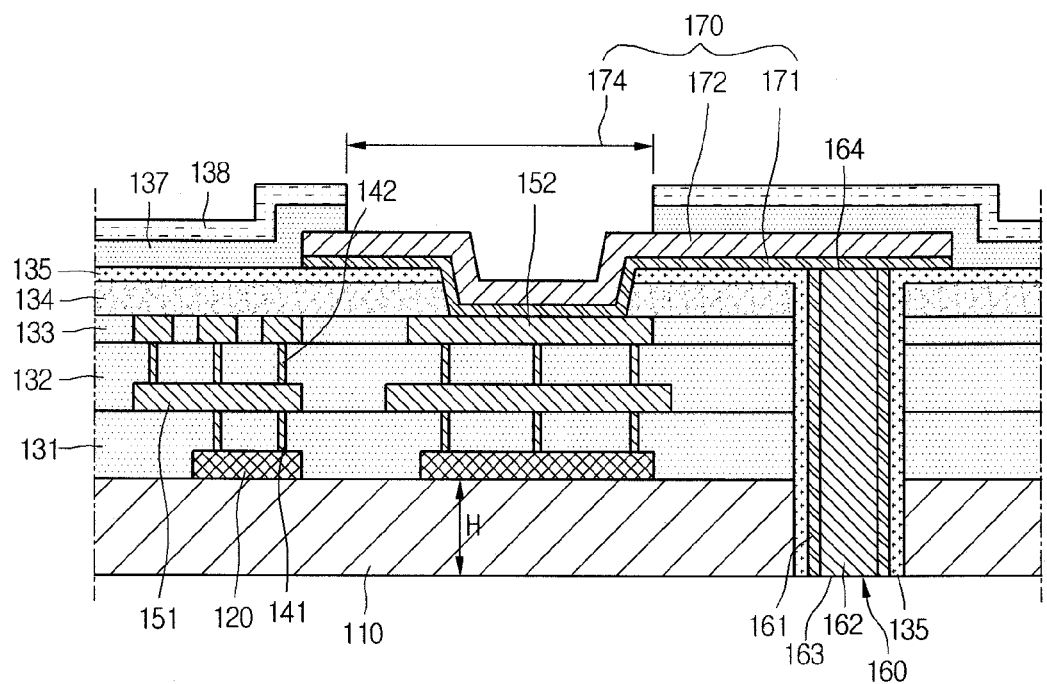

SEMICONDUCTOR CHIP, METHOD OF FABRICATING THE SAME AND STACK PACKAGE HAVING THE SAME

The present application claims priority under 35 U.S.C. §119 and 35 U.S.C. §365 to Korean Patent Application No. 10-2007-0069967 (filed on Jul. 12, 2007), which is hereby incorporated by reference in its entirety.

BACKGROUND

Current electronic products have been rapidly expanded to a portable market. Components mounted on a portable electronic product should be light, thin, short, and small. In order to make the components having such physical properties, technology for reducing an individual size of a semiconductor package, which is a mounting component, system-on-chip (SOC) technology for making a plurality of individual semiconductor chips into a single chip, and system-in-package (SIP) technology of integrating a plurality of individual semiconductor chips into one package are required. When integrating the plurality of individual semiconductor chips into a single package, physical strength should be improved and performance and reliability between the chips arranged in the package should be improved.

SUMMARY

Embodiments relates to a semiconductor chip, a method for fabricating the same, and a stack package having the same.

Embodiments relates to a semiconductor chip and a method for fabricating a semiconductor chip which utilizes a semiconductor chip stack package regardless of positions of semiconductor devices, interconnections, and deep vias.

Embodiments relates to a semiconductor chip that can include at least one of the following: a wafer; semiconductor devices formed on and/or over the wafer; upper metal layers electrically connected to the semiconductor devices; vias penetrating the wafer and dielectric layers arranged on and/or over the wafer; and an interconnection layer covering the ends of the vias and electrically connected to the vias and the upper metal layers.

Embodiments relates to a semiconductor chip that can include at least one of the following: a wafer; a semiconductor device formed on the wafer; a first dielectric layer formed on the wafer and the semiconductor device; a first metal interconnection formed on the first dielectric layer; a second dielectric layer formed on the first dielectric layer and the first metal interconnection; a third dielectric layer formed on the second dielectric layer; a second metal interconnection formed in the third dielectric layer and having an exposed uppermost surface; a first nitride layer formed on the third dielectric layer and the second metal interconnection, the first protective layer having a first hole exposing a portion of the second metal interconnection; a via hole extending through the wafer, the first dielectric layer, the second dielectric layer, the third dielectric layer and the first nitride layer; a via formed in the via hole, the via having an exposed lower end and an exposed upper end; and a third metal interconnection formed on the exposed upper end of the via and the second metal interconnection exposed by the first hole and the second hole.

Embodiments relates to a method for fabricating a semiconductor chip that can include at least one of the following steps: forming semiconductor devices on and/or over a wafer; and then forming dielectric layers covering the semiconductor devices; and then forming upper metal layers electrically connected to the semiconductor devices; and then forming vias penetrating through a portion of the wafer and the dielectric layers and the protective layers; and then forming interconnection layers covering the ends of the vias and electrically connected to the vias and the upper metal layers.

Embodiments relates to a semiconductor chip stack package chip that can include at least one of the following: a first semiconductor chip including a wafer; semiconductor devices formed on and/or over the wafer; upper metal layers electrically connected to the semiconductor devices; vias penetrating through the wafer and dielectric layers arranged on and/or over the wafer; interconnection layers covering the ends of the vias and electrically connected to the vias and the upper metal layers; a second chip stacked on and/or over the first semiconductor chip; and a conductive member arranged on and/or over the interconnection layer and electrically connected to the interconnection layer and the second semiconductor chip.

Embodiments relates to a method for fabricating a semiconductor chip that can include at least one of the following steps: forming a semiconductor device formed on the wafer; and then forming a first dielectric layer on the semiconductor device; and then forming a first metal interconnection on the first dielectric layer; and then sequentially forming a second dielectric layer on the first dielectric layer and the first metal interconnection and a third dielectric layer on the second dielectric layer; and then forming a second metal interconnection in the third dielectric layer; and then forming a first nitride layer on the third dielectric layer and the second metal interconnection, the first protective layer having a first hole exposing a portion of the second metal interconnection; and then forming a via extending through the wafer, the dielectric layers and the first nitride layer, the via having an exposed lower end and an exposed upper end; and then forming a third metal interconnection on the exposed upper end of the via and the second metal interconnection exposed by the first hole and the second hole.

Embodiments relates to a semiconductor chip stack package chip that can include at least one of the following: a first semiconductor chip including a semiconductor device formed on a wafer, a via formed in the via hole and a metal interconnection electrically connected to the semiconductor device, the metal interconnection including a pad region; a conductive member having a first surface contacting the pad region and an exposed second surface; and a second semiconductor chip stacked on the first semiconductor chip using the exposed second surface of the conductive member. In accordance with embodiments, the conductive member electrically connects the first semiconductor chip to the second semiconductor chip

DRAWINGS

Example FIG. 1 illustrates a cross-sectional view of a semiconductor chip in accordance with embodiments.

Example FIGS. 2A to 2K illustrate a process according to a method for fabricating a semiconductor chip in accordance with embodiments.

Figure 3:
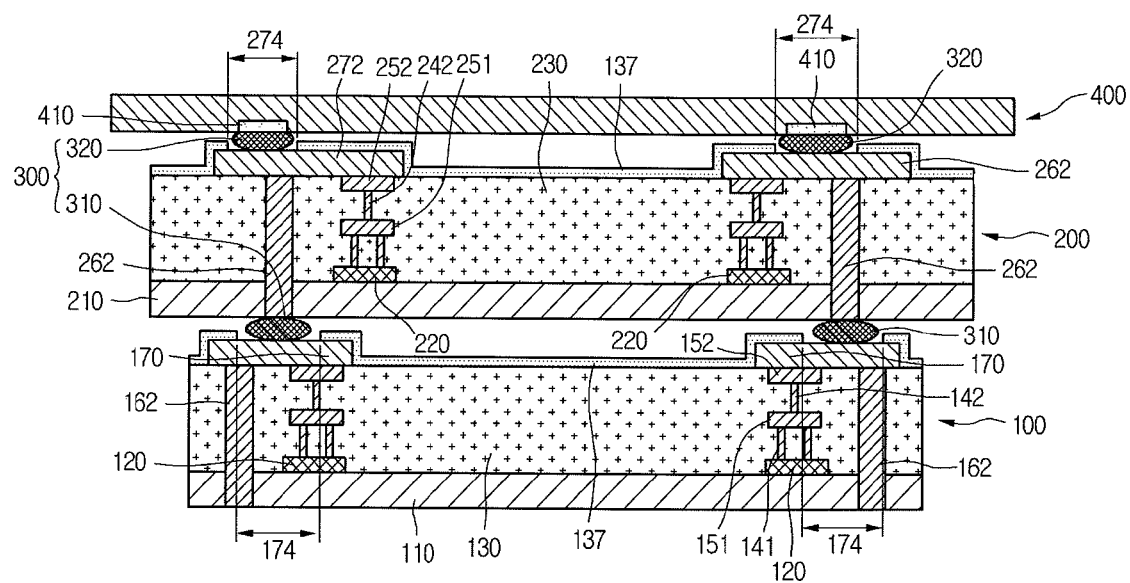

Example FIG. 3 illustrates a semiconductor chip stack package in accordance with embodiments.

DESCRIPTION

As illustrated in example FIG. 1, a semiconductor chip in accordance with embodiments may include silicon wafer 110, semiconductor device 120, first dielectric layer 131, second dielectric layer 132 and third dielectric layer 133, first via 141, second via 142, lower interconnection 151, upper metal 152, first protective layer 134, second protective layer 137 and third protective layer 138, buffer layer 135, barrier metal 161, deep via 162 and interconnection layer 170. Silicon wafer 110 may have a rectangular-type shape and may be composed of single crystal silicon. Silicon wafer 110 may have thickness H of between 40 µm to 60 µm. Semiconductor device 120 may be formed on and/or over silicon wafer 110 and may be composed as a DMOS transistor, a CMOS transistor, a bi-junction transistor, a diode, or the like. Semiconductor device 120 may include a gate electrode, a source electrode, a drain electrode, and a channel region, or the like. First dielectric layer 131 may be formed on and/or over to contact and cover wafer 110 and semiconductor device 120 for insulating semiconductor device 120. Second dielectric layer 132 may be formed on and/or over first dielectric layer 131 to cover and also insulate lower interconnection 151. Third dielectric layer 133 may be formed on and/or over second dielectric layer 132. Upper metal layer 152 may be formed in third dielectric layer 133 such that an uppermost surface thereof is exposed and such that third dielectric layer 133 insulates sidewalls of upper metal layer 152.

First vias 141 penetrate through first dielectric layer 131 for electrical connection to semiconductor device 120. Second via 142 penetrates through second dielectric layer 132 for electrical connection to lower interconnection 151. Lower interconnection 151 may be formed on and/or over first dielectric layer 131. In such a structure, semiconductor device 120 and lower interconnection 151 are electrically connected to each other by first via 141. Upper metal 152 may be formed on and/or over second dielectric layer 132. Therefore, in such a structure, lower interconnection 151 and upper metal layer 152 are electrically connected to each other by second via 142. Therefore, upper metal layer 152 is electrically connected to semiconductor device 120 through first vias 141, second vias 142 and lower interconnection 151. First vias 141, lower interconnection 151, second vias 142 and upper metal layer 152 may each be composed of at least one of copper (Cu), tungsten (W), and aluminum (Al), or the like.

First protective layer 134 may be formed on and/or over third dielectric layer 133 to cover upper metal layer 152. First protective layer 134 may include a first hole exposing a portion of the uppermost surface of upper metal layer 152. First protective layer 134 may be composed of nitride or the like and have a thickness in a range of about 2000 Å to 3000 Å. Deep via hole 160 may be formed to penetrate through silicon wafer 110, first dielectric layer 131, second dielectric layer 132, third dielectric layer 133 and first protective layer 134. The diameter of the deep via hole 160 may be in a range of about 10 µm to 30 µm. Buffer layer 135 may then be formed on and/or over an uppermost surface of first protective layer 134 and on sidewalls of deep via hole 160. Buffer layer 135 may be composed of an oxide or the like. Buffer layer 135 may include a second hole exposing a portion of the uppermost surface of upper metal layer 152. Buffer layer 135 may serve to prevent diffusion of metal forming deep via 162 into silicon wafer 110 and/or dielectric layers 131, 132, 133. Barrier metal layer 161 may be formed on and/or over buffer layer 135 and also serve to prevent diffusion of metal forming deep via 162 into silicon wafer 110 and/or dielectric layers 131, 132, 133. Deep via 162 may then be formed in deep via hole 160. Deep via 162 may be composed of a metal material such as copper, copper alloy, tungsten, silver and the like. Deep via 162 may have a pillar geometric shape and/or a cylindrical geometric shape. Deep via 162 has an exposed lower end 163 and upper end 164 which is covered by interconnection layer 170.

Interconnection layer 170 may be formed on and/or over buffer layer 135 and covers upper end 164 of deep via 162 and a portion of the uppermost surface of upper metal layer 152 exposed by the first hole and the second hole. Therefore, interconnection layer 170 may be electrically connected to deep via 162 and upper metal layer 152. Interconnection layer 170 may have a multi-layered structure including first interconnection layer 171, second interconnection layer 172 and pad region 174. First interconnection layer 171 may be formed on and/or over upper end 164 of deep via 162 and upper metal layer 152 exposed by the first hole and the second hole. First interconnection layer 171 may serve to prevent diffusion of metal used in upper metal layer 152 and deep via 162. First interconnection 171 may serve to connect deep via 162 and second interconnection 172. In essence, first interconnection 171 may serve as a buffer layer connecting two metals when deep via 162 is composed of copper and the second interconnection 172 is composed of aluminum. Second interconnection 172 may be formed to be stacked on and/or over first interconnection 171 and may be composed of a metal such as aluminum, aluminum alloys and the like. Pad region 174 may be exposed by a third hole and a fourth hole for electrical connection to another semiconductor chip or a PCB substrate, or the like, through a conductive member.

Second protective layer 137 may then be formed on and/or over buffer layer 135 and a portion of interconnection layer 170. Second protective layer 137 may serve to protect interconnection layer 170 and includes the third hole exposing pad region 174. Second protective layer 137 may be composed of an oxide and the like. Third protective layer 138 may then be formed on and/or over second protective layer 137 and serve to protect interconnection layer 170. Third protective layer 138 may include the fourth hole exposing pad region 174. Third protective layer 138 may be composed of a nitride material.

Another semiconductor chip may be stacked on and/or over the semiconductor chip in accordance with embodiments. Another semiconductor chip may be electrically connected through the conductive member arranged on and/or over pad region 174. Pad region 174 may be formed at a desired position on and/or over the uppermost surface of the semiconductor chip. Therefore, embodiments may provide a semiconductor chip capable of more freely implementing a semiconductor chip stack package. Also, embodiments can provide a semiconductor chip capable of forming deep via 162 at a desired position.

Figure 2A:
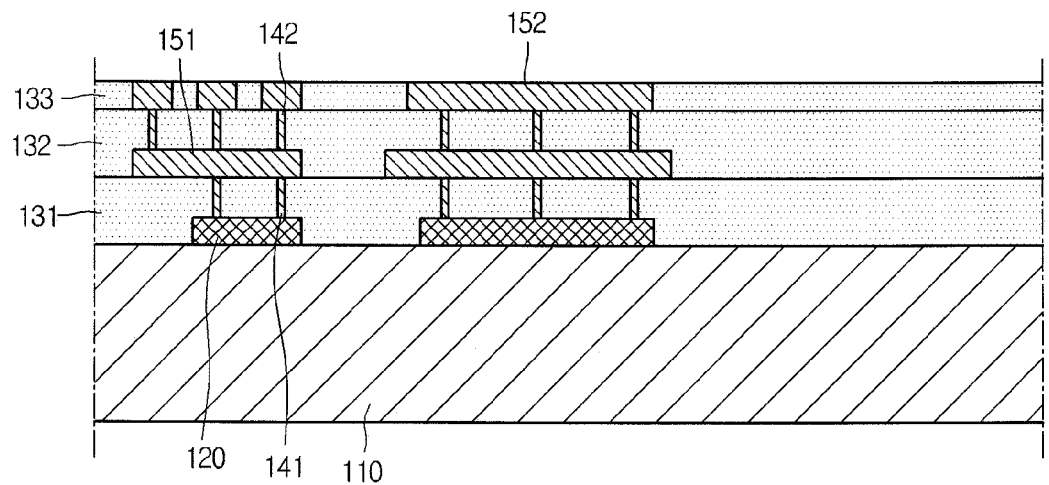

As illustrated in example FIG. 2A, a method for fabricating a semiconductor chip in accordance with embodiments may include forming semiconductor devices 120 on and/or over silicon wafer 110. First dielectric layer 131 may then be formed on and/or over silicon wafer 110 including semiconductor devices 120. First vias 141 may then be formed penetrating through first dielectric layer 131 and electrically connected to semiconductor devices 120. Lower interconnection 151 may then be formed on and/or over first dielectric layer 131 and electrically connected to first via 141. Second dielectric layer 132 may then be formed on and/or over first dielectric layer 131 including lower interconnection 151. Second vias 142 may then be formed penetrating through second dielectric layer 132 and electrically connected to lower interconnection 151. Third dielectric layer 133 may then be formed on and/or over second dielectric layer 132. Upper metal layer 152 may be formed in a hole in third dielectric layer 133 and also on and/or over third dielectric layer 133. Upper metal layer 152 and third dielectric layer 133 may then be planarized by a chemical mechanical polishing (CMP) process to expose the uppermost surface of upper metal layer 152. Examples of materials for use as first via 141, lower interconnection 151, second via 142 and upper metal layer 152 may include copper (Cu) and tungsten (W) and the like.

Figure 2B:
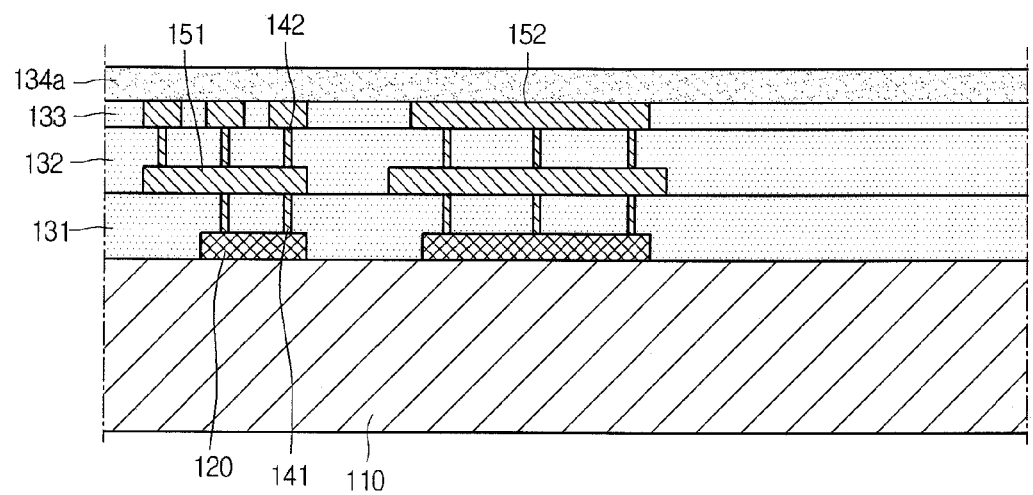

As illustrated in example FIG. 2B, after performing the CMP process, first nitride layer 134a serving as a protective layer may be formed on and/or over third dielectric layer 133 including upper metal layer 152. As an example of materials capable of being used as the first nitride layer 134a, there may be nitride and the like. First nitride layer 134a may be formed using a chemical vapor deposition (CVD) process and have a thickness in a range of about 2000 to 3000 Å.

Figure 2C:
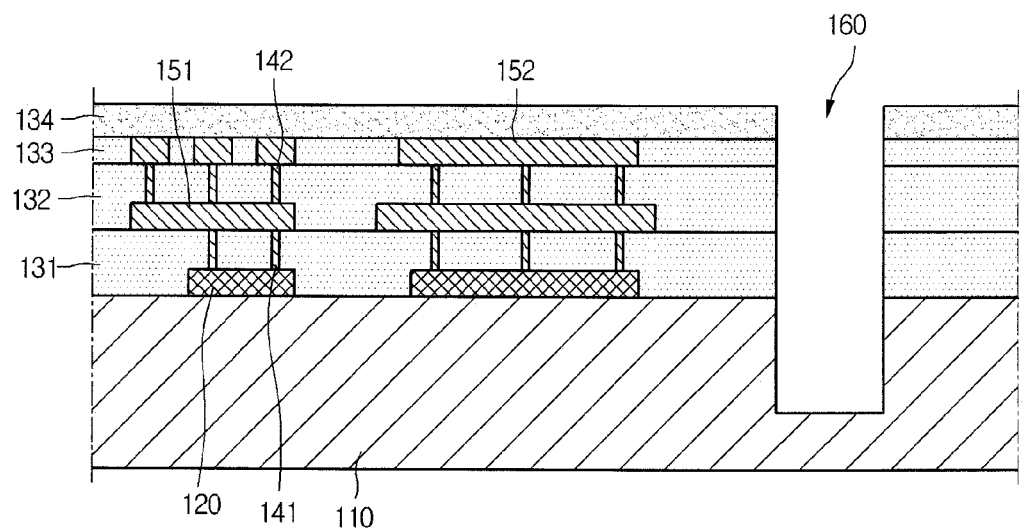

As illustrated in example FIG. 2C, after forming first nitride layer 134a, deep via hole 160 penetrating through portion of silicon wafer 110, first dielectric layer 131, second dielectric layer 132, third dielectric layer 133 and first nitride layer 134 may be formed. In order to form deep via hole 160, a photoresist film may be formed on and/or over first nitride layer 134 having a thickness in a range of about 2 to 5 μm and a selectivity of 90:1. In essence, the thickness of the photoresist film is removed by 1 while the thickness of first nitride layer 134, dielectric layers 131, 132, 133 and silicon wafer 110 is removed by 90 using an etching solution. The photoresist film is patterned by a photo process including an exposure process and a development process and the photoresist pattern is formed on and/or over first nitride layer 134. A portion of silicon wafer 110, first dielectric layer 131, second dielectric layer 132, third dielectric layer 133 and first nitride layer 134a may then be patterned using the photoresist pattern as an etching mask to form deep via hole 160 having a diameter of about 10 to 30 μm and a depth of about 50 μm.

Figure 2D:
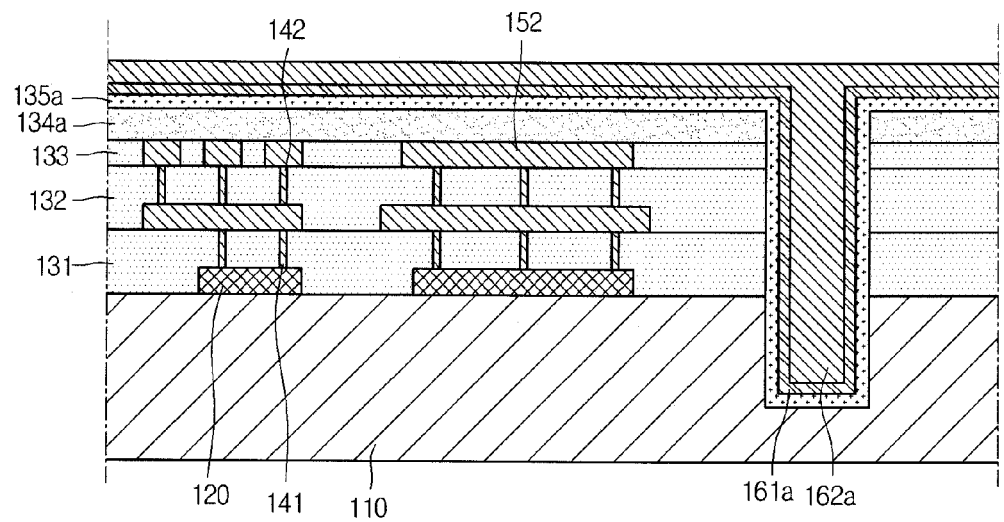

As illustrated in example FIG. 2D, after forming deep via hole 160, first oxide film 135a as a buffer layer may be formed on and/or over the uppermost surface of first nitride layer 134a and the sidewalls of deep via hole 160. An example of materials for use as first oxide film 135a is silicon oxide $SiO_x$ and the like. After forming first oxide film 135a, barrier metal layer 161 a may be formed on and/or over first oxide layer 135a. An example of materials for use as barrier metal layer 161a is at least one of titanium (Ti), titanium nitride (TiN), titanium silicon nitride (TiSiN), tantalum (Ta), tantalum nitride (TaN), tantalum silicon nitride (TaSiN) and the like. The thickness of barrier metal layer 161a may be in a range of about 1000 to 3000 Å. First oxide layer 135a and barrier metal layer 161a may be formed using a CVD process. After forming barrier metal layer 161a, deep via metal layer 162a may be formed on and/or over barrier metal layer 161a and in deep via hole 160. An example of materials for use as deep via metal 162a is copper, copper alloy, tungsten, silver and the like.

Figure 2E:
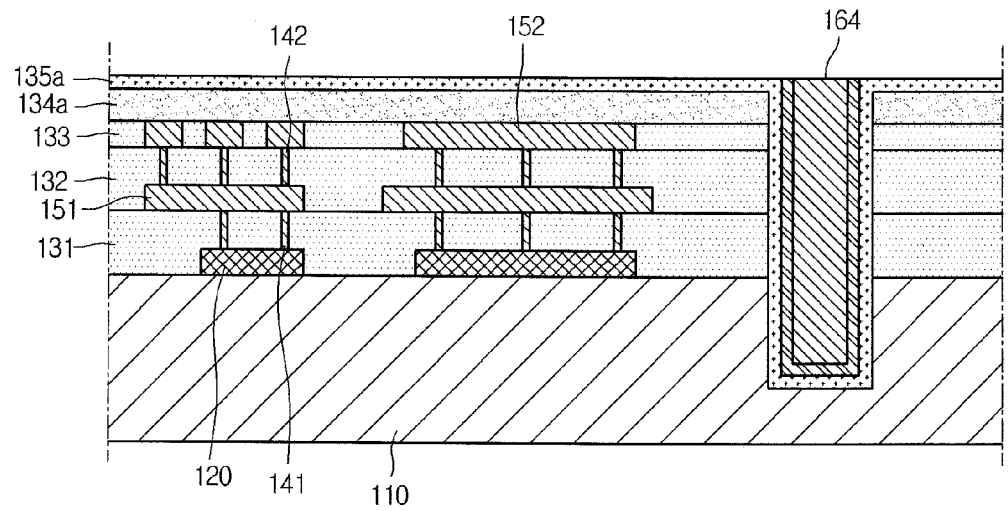

As illustrated in example FIG. 2E, after forming deep via metal 162a, a CMP process is performed to remove a portion of first oxide layer 135a formed on and/or over first nitride layer 134a, barrier metal layer 161a formed on and/or over first nitride layer 134a, and deep via metal 162a formed on and/or over first nitride layer 134a. First oxide layer 135a may then be planarized, thereby forming barrier metal layer 161 and deep via 162.

Figure 2F:
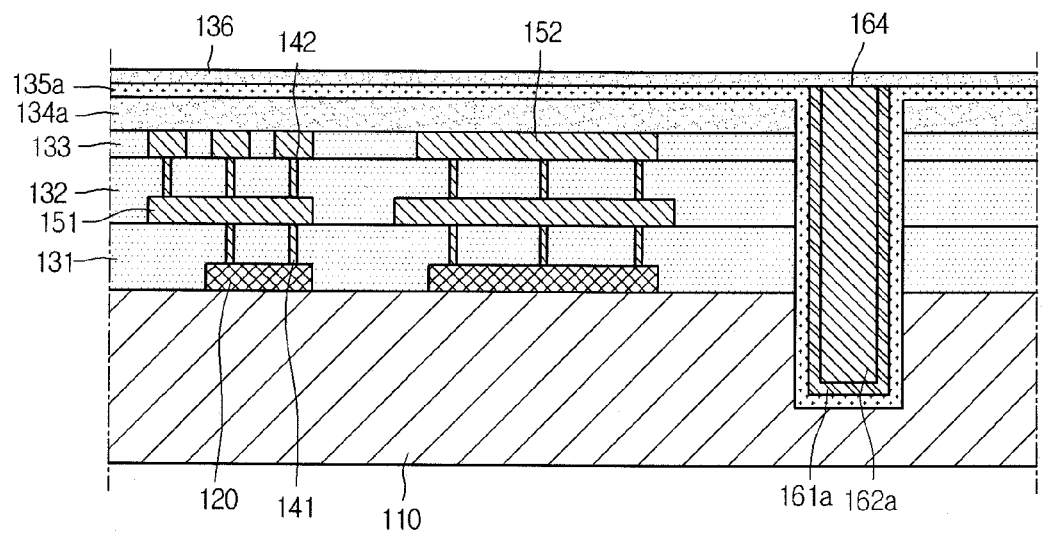

As illustrated in example FIG. 2F, second nitride layer 136 may then be formed on and/or over first oxide layer 135a in order to prevent the oxidation of deep via 162. The material forming second nitride layer 136 may be the same as the material forming first nitride layer 134a.

Figure 2G:
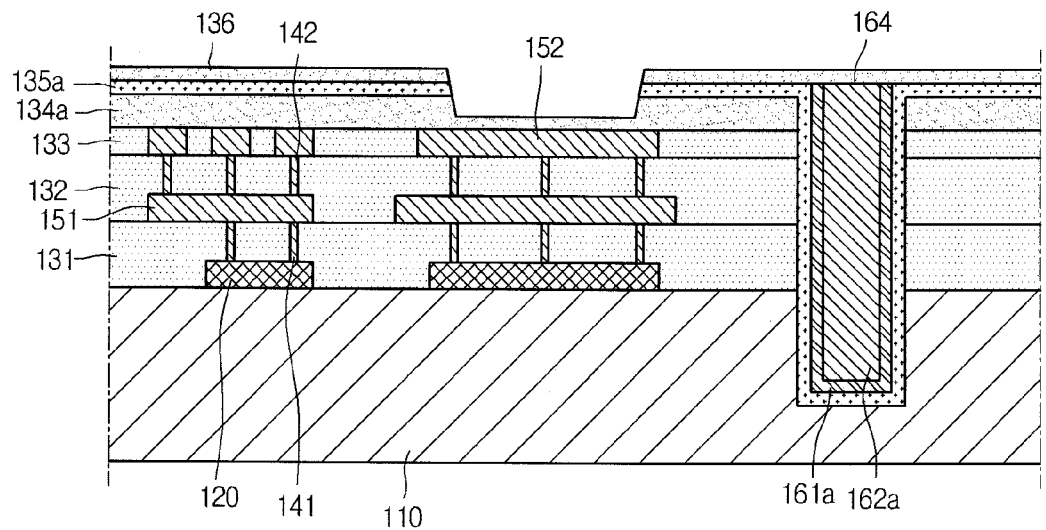

As illustrated in example FIG. 2G, after forming second nitride layer 136, a photoresist film may be formed on and/or over second nitride layer 136. The photoresist layer may then be patterned by a photo process including an exposure and development process. A photo resist pattern exposing a portion of second nitride layer 136 corresponding to a portion of upper metal layer 152 may be formed on the second nitride layer 136. A portion of first nitride layer 134a, first oxide layer 135a and second nitride layer 136 may then be patterned using the photoresist pattern as an etching mask such that second nitride layer 136 corresponding to a portion of upper metal layer 152 and first oxide layer 135 corresponding to a portion of upper metal layer 152 may be removed. However, a portion of first nitride layer 134a corresponding to a portion of upper metal layer 152 remains by a predetermined thickness and the uppermost surface of first nitride layer 134a corresponding to a portion of upper metal layer 152 is removed. The thickness is the same as the thickness of second nitride layer 136.

Figure 2H:
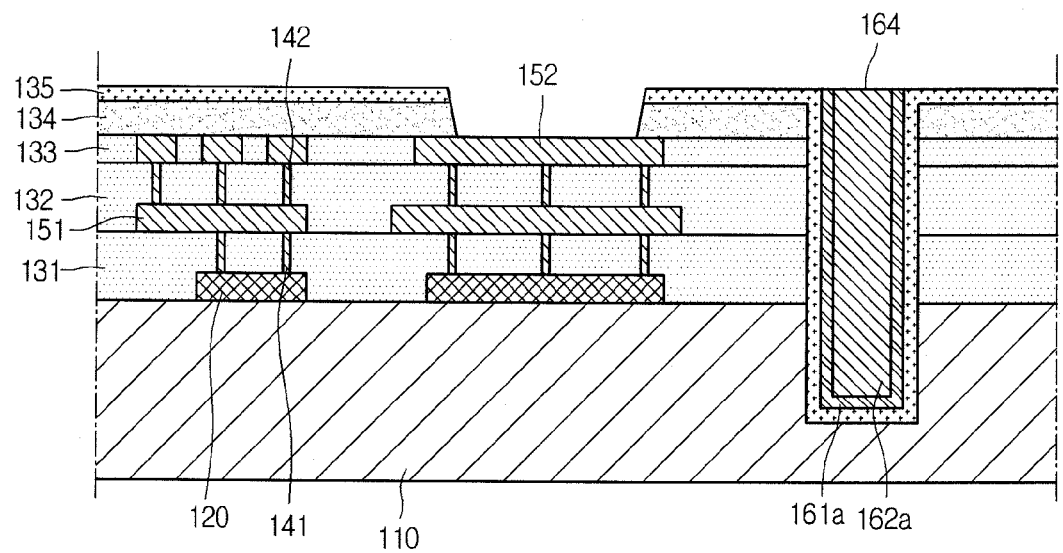

As illustrated in example FIG. 2H, second nitride layer 136 and first nitride layer 134a remaining by the predetermined thickness may then be removed by a blanket etching process to thereby form first protective layer 134 and buffer layer 135. First protective layer 134 and buffer layer 135 exposes a portion of upper metal layer 152. Upper end 164 of deep via 162 is exposed by the removal of second nitride layer 136.

Figure 2I:
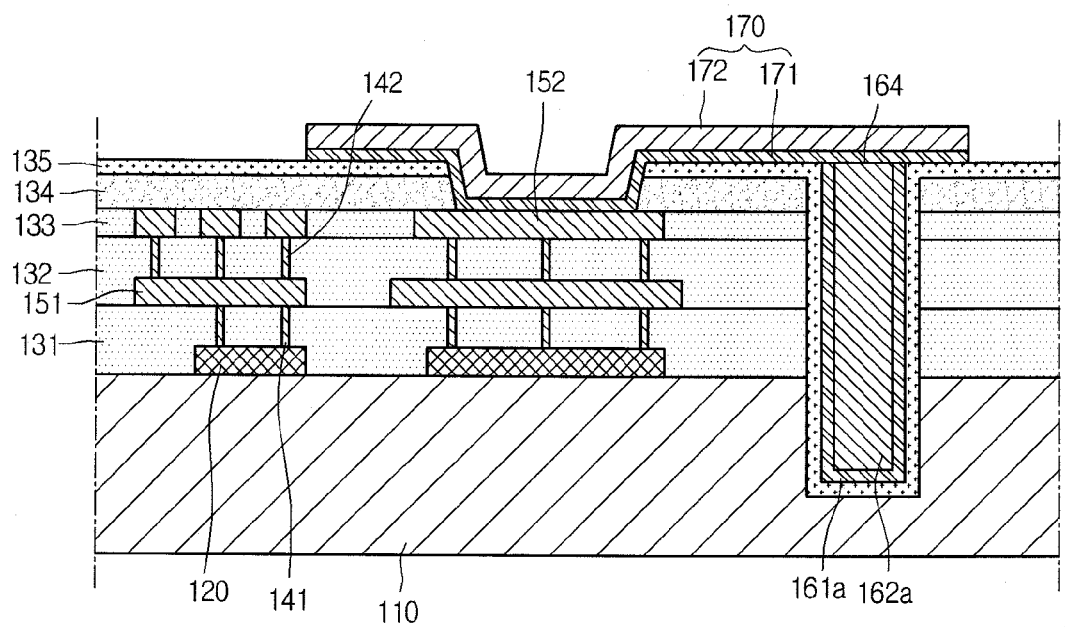

As illustrated in example FIG. 2I, after removing second nitride layer 136 and first nitride layer 134a, first redistribution metal layer 171 covering first oxide layer 135, a portion of upper metal layer 152, and upper end 164 of deep via 162 may then be formed over the area. An example of materials for use as first redistribution metal layer 171 is at least one of titanium, titanium nitride, titanium silicon nitride, tantalum, tantalum nitride, and tantalum silicon nitride and the like. Second redistribution metal layer 172 may then be formed on and/or over and covering first redistribution metal layer 171. An example of materials for use as second redistribution metal layer 172 is aluminum, aluminum alloys and the like. First redistribution metal layer 171 and second redistribution metal layer 172 may then be patterned through a mask process and the exposed upper metal layer 152 and interconnection layer 170 covering upper end 164 of deep via 162. Distribution layer 170 including first redistribution metal layer 171 and second redistribution metal layer 172 may serve to electrically connect to upper metal layer 152 and deep via 162.

Figure 2J:
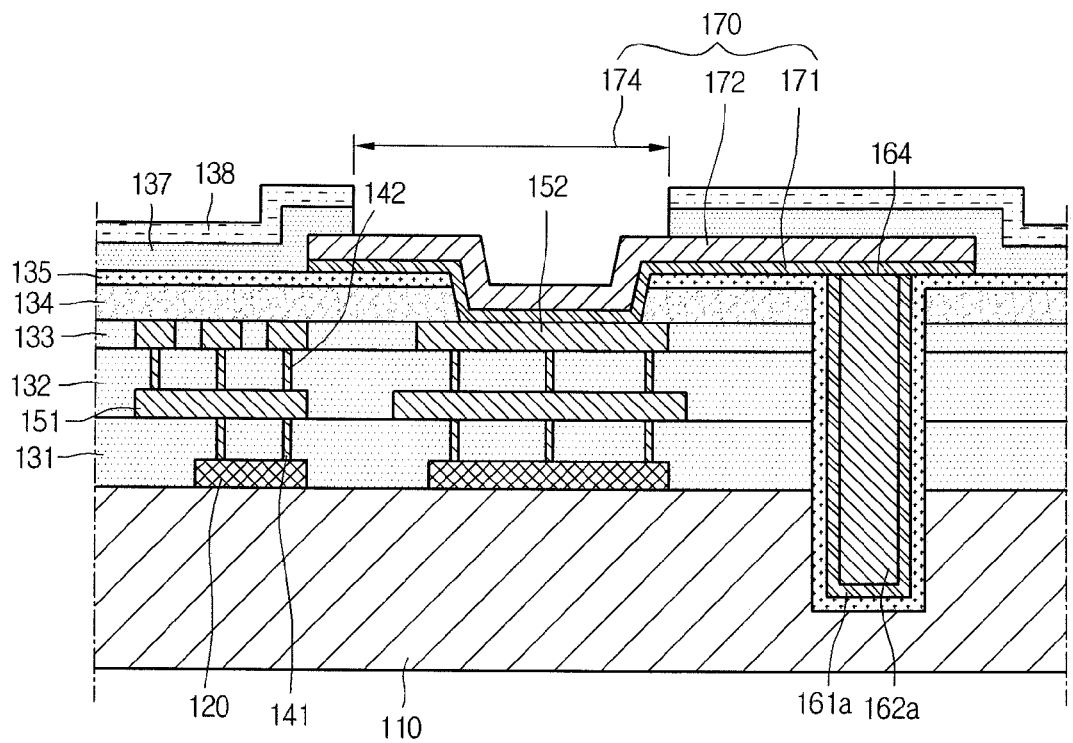

As illustrated in example FIG. 2J, after forming distribution layer 170, second oxide layer 137 serving as a second protective layer and third nitride layer 138 serving as a third protective layer may be sequentially formed on and/or over interconnection layer 170 and buffer layer 135. An example of materials for use as second oxide layer 137 may include undoped silicon glass (USG), tetra othrosilicate (TEOS) oxide and the like. The thickness of second oxide layer 137 may be in a range between about 10000 to 15000 Å. An example of materials for use as third nitride layer 138 may include silicon nitride $SiN_x$ and the like. The thickness of third nitride layer 138 may be in a range of between about 10000 to about 13000 Å. Second oxide layer 137 and third nitride layer 138 may then be patterned through a mask process to expose a portion of interconnection layer 170. Pad region 174 at the exposed interconnection layer 170 may be formed for electrical connection to the external.

Figure 2K:
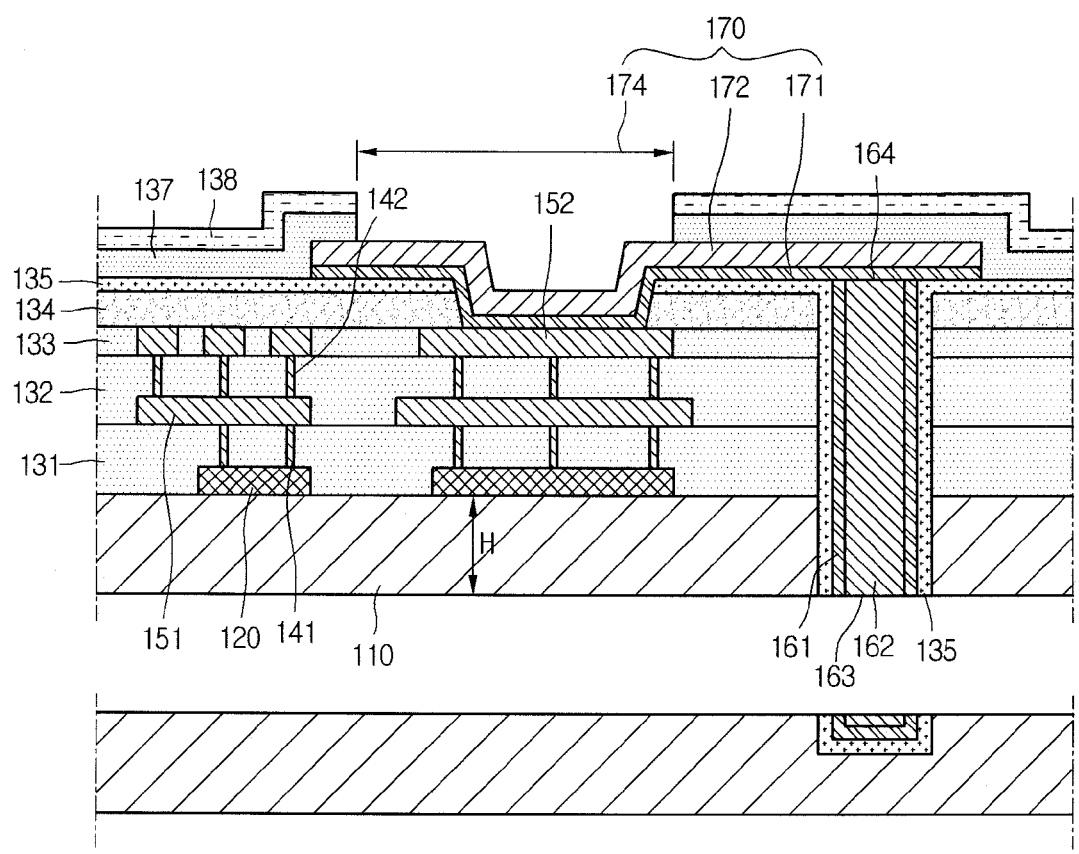

As illustrated in example FIG. 2K, after forming second protective layer 137 and third protective layer 138, the lowermost surface of silicon wafer 110, buffer layer 135, barrier metal layer 161 and a portion of deep via 162 may be cut to expose lower end 162 of deep via 162. Thickness H of the remaining silicon wafer is about 40 μm to 60 μm.

As illustrated in example FIG. 3, a semiconductor chip stack package including a semiconductor chip in accordance with embodiments is provided. For the semiconductor chip stack package, the first semiconductor chip and the second conductor chip refers to the semiconductor chip fabricating using steps illustrated in example FIGS. 1 and 2A to 2K and described above. The semiconductor stack package may include first semiconductor chip 100, second semiconductor chip 200, conductive members 300 and circuit board 400. First semiconductor chip 100 may include first silicon wafer 110, first semiconductor device 120, dielectric layers 130 of first semiconductor chip 100, first upper metal 152, first deep via 162, first interconnection 170 and protective layer 137. An example of materials for use as first silicon wafer 110 may include single crystal silicon and the like. First semiconductor device 120 may be formed on and/or over first silicon wafer 110. Dielectric layers 130 of first semiconductor chip 100 may be formed on and/or over and covering first semiconductor device 120. First upper metal 152 may be formed on and/or over dielectric layers 130 and electrically connected to first semiconductor device 120 through interconnections 151 formed between dielectric layers 130 and vias 141, 142 penetrating through dielectric layers 130. First deep via 162 penetrates through dielectric layers 130 and first silicon wafer 110 and has at least one end thereof that is exposed. First interconnection 170 covers the exposed end of first deep via 162 and covers a portion or the whole of first upper metal 152. First interconnection 170 may be electrically connected to first deep via 162 and first upper metal 152. First interconnection 170 may include first pad region 174 exposed to the external. Protective layer 137 may cover a portion of first interconnection 170 and may include a hole exposing a portion of first pad region 174.

Second semiconductor chip 200 may be arranged on and/or over first semiconductor chip 100 and may include second silicon wafer 210, second semiconductor device 220, dielectric layers 230 of second semiconductor chip 200, second upper metal 252, second deep via 262, second interconnection 272 and protective layer 237. An example of materials for use as second silicon wafer 210 may include single crystal silicon and the like. Second semiconductor device 220 may be formed on and/or over second silicon wafer 210 and dielectric layers 230 may be formed on and/or over and covering second semiconductor device 220. Second upper metal 252 may be formed on and/or over dielectric layers 230 and second upper metal 252 and is electrically connected to second semiconductor device 220 through interconnections 251 arranged between dielectric layers 230 and vias 241, 242 penetrating through dielectric layers 230. Second deep via 262 penetrates through dielectric layers 230 and second silicon wafer 210. One end of second deep via 262 contacts and is electrically connected to conductive member 300. Second interconnection 272 covers the exposed end of second deep via 272 facing the end electrically connected to conductive member 300 and covers a portion of second metal 252. Second interconnection 272 may be electrically connected to second deep via 262 and second upper metal 252. Second interconnection 272 may include second pad region 174 exposed to the external. Protective layer 237 covers second interconnection 272 and protective layer 237 and may include a hole exposing second pad region 274. Conductive member 300 may include first conductive member 310 and second conductive member 320. First conductive member 310 may be interposed between first semiconductor chip 100 and second semiconductor chip 200 so that first conductive member 310 contacts and is electrically connected to first pad region 174 and second pad region 274. In other words, first conductive member 310 electrically connects first semiconductor chip 100 to second semiconductor chip 200. Second conductive member 320 may be interposed between first semiconductor chip 100 and circuit board 400 so that second conductive member 320 contacts and is electrically connected to first pad region 174 and third pad region 410 to be described later. In other words, second conductive member 320 electrically connects first semiconductor chip 100 and circuit board 400 to be described later. Conductive member 300 may be composed of at least one of silver (Ag) and solder paste.

Circuit board 400 may be arranged on and/or over second semiconductor chip 200. When print interconnections are included in circuit board 400, circuit board 400 may include third pad region 410 electrically connected to the print interconnection and exposed to the external. Since first pad region 174 may be formed at a desired position, second deep via 262 formed corresponding to first pad region 174 may also be formed at a desired position. Therefore, the semiconductor chip stack package can be designed regardless of the positions of first semiconductor device 120, first top metal 152 and first deep via 162. In other words, first semiconductor chip 100 and second semiconductor chip 200 can be arranged at a desired position by first and second interconnections 170, 172 regardless of the positions of first and second semiconductor devices 120, 220, interconnections 151, 251, first and second upper metals 152, 252, and first and second deep vias 162, 262. Therefore, the semiconductor chip stack package capable of effectively arranging the semiconductor chips is formed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor chip comprising:
    a wafer;
    a semiconductor device formed on the wafer;
    a first dielectric layer formed on the wafer and the semiconductor device;
    a first metal interconnection formed on the first dielectric layer;
    a second dielectric layer formed on the first dielectric layer and the first metal interconnection;
    a third dielectric layer formed on the second dielectric layer;
    a second metal interconnection formed in the third dielectric layer and having an exposed uppermost surface;
    a first nitride layer formed on the third dielectric layer and the second metal interconnection, the first protective layer having a first hole exposing a portion of the second metal interconnection;

a via hole extending through the wafer, the first dielectric layer, the second dielectric layer, the third dielectric layer and the first nitride layer;

a via formed in the via hole, the via having an exposed lower end and an exposed upper end; and a third metal interconnection formed on the exposed upper end of the via and the second metal interconnection exposed by the first hole and the second hole.

2. The semiconductor chip of claim 1, wherein the semiconductor device comprises at least one of a DMOS transistor, a CMOS transistor, a bi-junction transistor and a diode.

3. The semiconductor chip of claim 1, further comprising:

a plurality of lower vias extending through the first dielectric layer to electrically connect the semiconductor device to the first metal interconnection; and a plurality of second vias extending through the second dielectric layer to electrically connect the first metal interconnection to the second metal interconnection.

4. The semiconductor chip of claim 1, wherein the third metal interconnection layer is electrically connected to the via and the second metal interconnection.

5. The semiconductor chip of claim 4, wherein the third metal interconnection layer comprises a multi-layered structure including a fourth metal interconnection layer and a fifth metal interconnection layer.

6. The semiconductor chip of claim 5, wherein the interconnection layer includes a pad region.

7. The semiconductor chip of claim 1, further comprising:

a first oxide layer formed on the first nitride layer and on sidewalls of the via hole, the first oxide layer including a second hole corresponding spatially to the first hole; and a barrier metal layer formed interposed between the first oxide layer and the via.

8. The semiconductor chip of claim 7, further comprising:

a second oxide layer formed on the first oxide layer and a portion of the third metal interconnection, the second oxide layer having a third hole exposing a portion of the third metal interconnection; and a second nitride layer formed on the second oxide layer, the second nitride layer having a fourth hole corresponding spatially to the third hole.

* * * * *